United States Patent
Chen et al.

(10) Patent No.: US 8,710,767 B2
(45) Date of Patent: Apr. 29, 2014

(54) CONTROL DEVICE WITH ADJUSTING PULSE WIDTH MODULATION FUNCTION AND THE BACKLIGHT MODULE THEREOF

(75) Inventors: Che-Sheng Chen, Taipei (TW); Hung-Ta Sung, Hsinchu (TW)

(73) Assignee: Luxmill Electronic Co., Ltd., Hsinchu (TW)

(*) Notice: Subject to any disclaimer, the term of this patent is extended or adjusted under 35 U.S.C. 154(b) by 124 days.

(21) Appl. No.: 13/447,820

(22) Filed: Apr. 16, 2012

(65) Prior Publication Data
US 2013/0049637 A1  Feb. 28, 2013

(30) Foreign Application Priority Data
Aug. 23, 2011  (TW) .............................. 100130184 A

(51) Int. Cl.
*H05B 37/02* (2006.01)
*H03K 7/08* (2006.01)

(52) U.S. Cl.
USPC .......................................... 315/297; 375/238

(58) Field of Classification Search
None
See application file for complete search history.

(56) References Cited

U.S. PATENT DOCUMENTS

| 7,239,116 B2* | 7/2007 | Tang .............................. 323/282 |
| 2010/0061442 A1* | 3/2010 | O'malley et al. .............. 375/238 |
| 2011/0080104 A1* | 4/2011 | Gray et al. ..................... 315/246 |
| 2011/0141780 A1* | 6/2011 | O'Malley et al. ............. 363/123 |

* cited by examiner

*Primary Examiner* — Jany Richardson
(74) *Attorney, Agent, or Firm* — Ming Chow; Sinorica, LLC

(57) ABSTRACT

A voltage converter with a sampling-hold and integrating circuit is provided herein. According to the minimum different value generated by the practical status of each of the illuminant channels in the LED backlight module, the sampling-hold and integrating circuit will generate an superposition voltage and the voltage converter can output different PWM signal to drive each of the illuminant channels in the backlight module. When the sampling-hold and integrating circuit of the voltage converter and the control device with adjusting pulse width function are embedded together to provide to the LED backlight module, the power saving is more convenient.

20 Claims, 11 Drawing Sheets

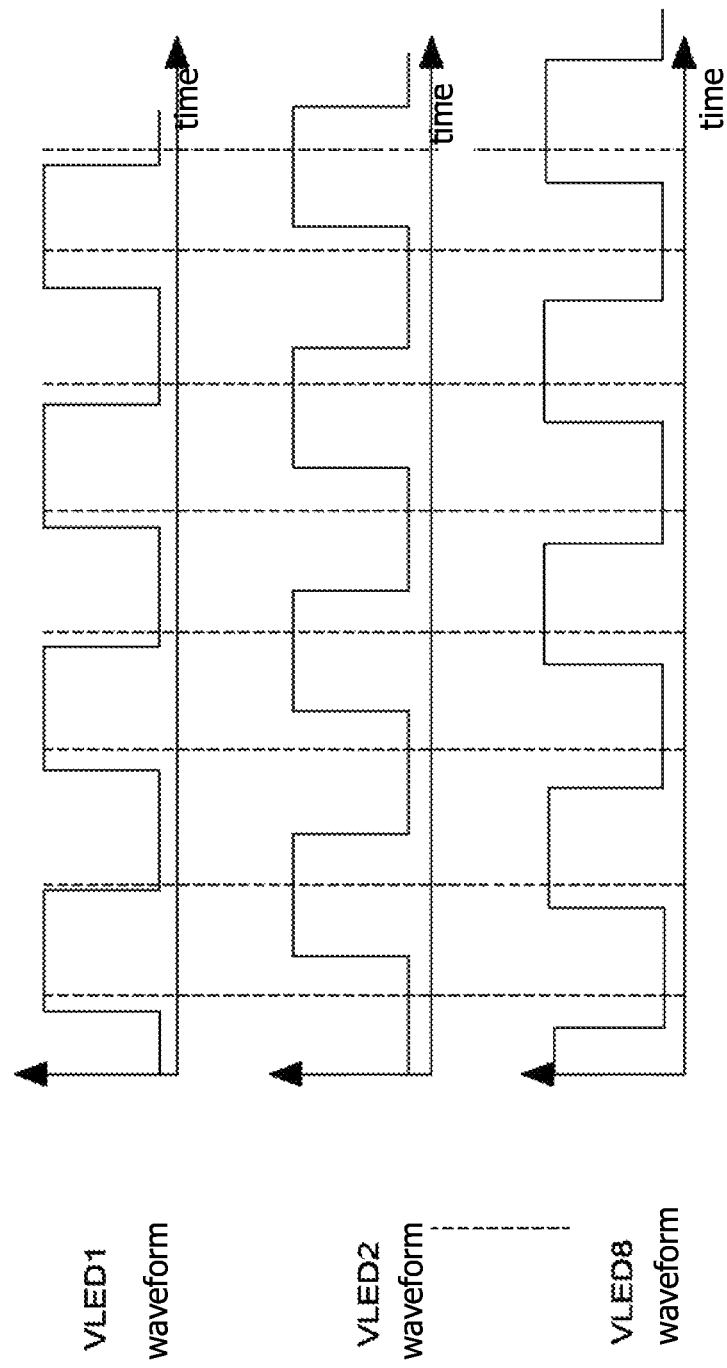

CONTROL DEVICE WITH ADJUSTING PULSE WIDTH MODULATION FUNCTION AND THE BACKLIGHT MODULE THEREOF

The current application claims a foreign priority to the patent application of Taiwan No. 100130184 filed on Aug. 23, 2011.

BACKGROUND OF THE INVENTION

1. Field of the Invention

The present invention is an adjusting device of the light emitting diode (LED) backlight module, and more particularly is to provide the most suitable pulse width modulation (PWM) in each of the channels of the LED backlight module before driving the LED backlight module.

2. Description of the Prior Art

The backlight module of the large scale Liquid Crystal Display (LCD) TV is using Cold Cathode Fluorescent Lamp (CCFL) or Light Emitting Diode (LED) to be the light source. Because the CCFL light tube implements the mercury (HG) to be the illuminant light source, the mercury will cause the environmental protection problem during manufacturing and recycling. In addition, the CCFL tube must be isolated from air to increase the life time. The LED technology is well developed and the illuminant efficiency is better than the CCFL tube and the LED technology is flexible and easy in color and illuminant control. Therefore, the direct backlight module made by LED is going to substitute the CCFL tube to be the backlight module in LCD.

Please referring to FIG. 1A, it is a view illustrating a direct backlight module made by conventional LED. As shown in FIG. 1A, the direct backlight module 400 is made by several illuminant channels (401-40n, n is an integral) and each of the illuminant channels 401 includes many LEDs 500. One of the significant drawbacks in the LED direct backlight module is the illuminant of the individual LEDs is not all the same, especially when red light, green light and blue light LEDs are together to generate white light. The color temperature of the white light is difficult to control. Moreover, the illuminant of the different color light LED includes different temperature reaction. When LED has been worked for a period time, the temperature of LED is increased as time goes on and the illuminant difference in each of the LED is increased. For example, when the room temperature is increased over 80° C., the attenuation of the red light LED is more than the blue light LED, and the attenuation of the blue light LED is more than the green light LED. Therefore, the direct backlight module made by several LEDs is easily affected by the different color LED so as to vary the color temperature and the even illumination.

Moreover, in prior art, the analog driving circuit of the LED is configured to drive the direct backlight module transmits the control signal generated by the triangle wave generator and the amplifier to the DC-DC converter 600 (such as buck type or boost type DC-DC converter) so as to control turning the LED on or off. When the DC-DC converter 600 is configured to drive the LED array, the lumen in each of the LED is varied in accordance with the difference of the forward bias. Therefore, it is difficult to control the color temperature and the illuminant of the LED array.

In addition, in order to determine the voltage variation in each of the LED, some technologies utilizes the look-up table. However, those methods are required lots of memory, and those technologies are hard to be embedded in one chip.

Now, please referring to FIG. 1B, it is a block diagram illustrating the DC-DC converter of the LED backlight module in prior art. As shown in FIG. 1B. The voltage signal transmitted to the output voltage illuminant device 400 is that the pulse width modulation input and the output voltage are modulated by the current control circuit 53; the pulse width modulation (PWM) signal in each of the light channel is controlled to be transmitted to the select circuit 52 so as to select a pulse high signal at minimum conduction and at final, one voltage output (Vout) is transmitted to the illuminant device 400. Therefore, when the PWM signal is turned on at duty cycle, each of the light channels absorbs the current at the output voltage V (Vout). When the PWM signal is turned off at duty cycle, each of the light channels is closed. In prior art, a clamp circuit (not shown) is used to keep providing a stable voltage when the duty cycle is off. According to the description above, the PWM signal generated by the DC-DC converter and used to control each of the light channels uses the same frequency, the same phase and the same duty cycle to drive the illuminant device 400, as shown in FIG. 1C (the equivalent circuit of the illuminant device in FIG. 1B). Obviously, the equivalent circuit in FIG. 1C is not able to change the duty cycle and the phase of the PWM signal. It is not necessary to drive the illuminant device 400 by the PWM signal with the same duty cycle and the same phase. The better method is to provide proper PWM signal in accordance with the actual variation at each of the light channels.

Moreover, in order to overcome the problem that different phase in FIG. 1C cannot be solved; another conventional technique is to include a VFB resistor and a holding circuit in FIG. 1D so as to change the phase of the PWM signal. Therefore, the illuminant device 400 includes the PWM signal with different phase to drive the illuminant device. However, the difficulty of the circuit design is increased and a feedback pin is added in the chip, so the manufacture cost is increased.

SUMMARY OF THE INVENTION

In order to solve the drawbacks described above, the main object of the present invention is to provide a voltage converter with a sampling-hold and integrating circuit. According to the minimum different value generated by the practical status of each of the illuminant channels in the LED backlight module, the sampling-hold and integrating circuit will generate a superposition voltage by superposition theory and the voltage converter can output an analog signal to drive each of the illuminant channels in the backlight module. When the sampling-hold and integrating circuit of the voltage converter and the control device with adjusting pulse width function are embedded together to provide to the LED backlight module, the power saving is more convenient.

Another object of the present invention is to provide a control device with adjusting pulse width function. According to the information of the adjusting loops and the design of the sampling-hold and integrating circuit, the control device in the present invention is able to adjust the PWM signal in accordance with the practical status of each of the illuminant channels. Therefore, each of the illuminant channels is driven in accordance with the PWM signal with the same frequency, different phase and different duty cycle. The control device in the present invention is not only configured to provide proper current to each of the illuminant devices to avoid the inconsistent of the illuminant or color because of the bad driving of the LED backlight module but also to drive the illuminant device by the PWM signal generated by the sampling-hold and integrating circuit. The power saving is more convenience.

One another object of the present invention is to provide a module unit with adjusting pulse width function. The module unit is configured to convert the analog PWM signal to be digital PWM control signal. The digital PWM control signal is executed by the adjusting unit and transmitted to the constant current regulator so as to control the current consistent of the LED backlight module.

One object of the present invention is to provide a control device with adjusting pulse width function. According to the information of the adjusting loops, the control device can adjust the PWM signal in accordance with the practical status of each of the illuminant channels in the LED backlight module and provide proper current in each of the illuminant channels. Therefore, the PWM signal in the present invention with the same frequency, different phase and different duty cycle can be used to drive each of the illuminant channels in the backlight module so as to avoid the inconsistent of the illuminant or color because of back driving of the LED backlight module.

According objects described above, a voltage converter includes one end connected to a constant current regulator and the constant current regulator is connected to a PWM signal of the illuminant channels, and the voltage converter includes a minimum voltage selector, a sampling-hold and integrating circuit and a boost circuit. The minimum voltage selector includes an input end respectively connected to a PWM signal of the illuminant channels and a plurality of first reference voltages corresponding to the plurality of illuminant channels, and an output end outputs a pulse high signal at the minimum conduction. The sampling-hold and integrating circuit includes a first input end and a second input end, and the first input end is connected to the pulse high signal of the minimum voltage selector and outputs a superposition voltage by superposition theory. The boost circuit includes a first input connected to the superposition voltage of the sampling-hold and integrating circuit, a second input end is connected to a second reference voltage, and an output end is connected to the illuminant channel in the LED backlight module. The second voltage dividing circuit provides a note voltage and the note voltage is connected to the second input end of the sampling-hold and integrating circuit and the boost circuit, and the note voltage is calculated by the output voltage and the second voltage dividing circuit by a voltage dividing theory. The superposition voltage is calculated by the first voltage dividing circuit of the sampling-hold and integrating circuit, the pulse high signal and the note voltage by the superposition theory.

A LED backlight module connected to a PWM signal and the LED backlight module includes a LED backlight module made by a plurality of illuminant channels and a constant current regulator. The LED backlight module is made by a plurality of illuminant channels. The constant current regulator includes a first input end connected to the illuminant channel of the LED backlight module, a second input end connected to the PWM signal and an output end configured to output the PWM signal of the illuminant channel. The voltage converter includes a minimum voltage selector, a sampling-hold and integrating circuit, and a boost circuit. The minimum voltage selector includes an input end respectively connected to a PWM signal of the illuminant channels and a plurality of first reference voltages corresponding to the plurality of illuminant channels, and an output end thereof outputting a pulse high signal at minimum conduction. The sampling-hold and integrating circuit includes a first input end and a second input end, and the first input end is connected to the pulse high signal of the minimum voltage selector and outputs a superposition voltage. The boost circuit includes a first input connected to the superposition voltage of the sampling-hold and integrating circuit, a second input end connected to a second reference voltage, and an output end connected to the illuminant channel in the LED backlight module. The second voltage dividing circuit provides a note voltage and the note voltage is connected to the second input end of the sampling-hold and integrating circuit and the boost circuit, and the note voltage is calculated by the output voltage and the second voltage dividing circuit by a voltage dividing theory. The superposition voltage is calculated by the first voltage dividing circuit of the sampling-hold and integrating circuit, the pulse high signal and the note voltage by the superposition theory. The control device is connected to the PWM signal and a plurality of adjusting loops outputted by the constant current regulator and outputs a plurality of digital signals to the input end of the constant current regulator.

A sampling-hold and integrating circuit includes first differential amplifier, a second differential amplifier and a first voltage dividing circuit. The first differential amplifier includes a first input end connected to an integrator and a second input end connected to an output end of the first differential amplifier to form a feedback loop. The second differential amplifier includes a first input end connected to a note voltage provided by the second voltage dividing circuit and a second input end is connected to a output end of the second differential amplifier. The first voltage dividing circuit is made by a plurality of resistors, and includes one end connected to the output end of the first differential amplifier and a second end connected to the output end of the second differential amplifier. The integrator is connected to the pulse high signal outputted by the output end of the minimum voltage selector at minimum conduction.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 9 is a signal view illustrating the PWM signal controls the LED backlight module in the present invention.

DESCRIPTION OF THE PREFERRED EMBODIMENT

The present invention is an adjusting apparatus of the light emitting diode (LED) backlight module, and more particularly is to provide the most suitable pulse width modulation (PWM) in each of the channels of the LED backlight module before driving the LED backlight module. The technique description of the LED or the LED backlight module is based on the prior art, so the detail description thereof is omitted herein. The following is the detailed description of the present invention, which describes a method of fabricating an integral device of a biochip integrated with micro thermo-electric elements and the apparatus, but the detailed structure composition and the operating theory are not discussed. The portions relating to the conventional techniques are briefly described, and the parts of the drawings are not proportionally drafted. While embodiments are discussed, it is not intended to limit the scope of the present invention. Except expressly restricting the amount of the components, it is appreciated that the quantity of the disclosed components may be greater than that disclosed. Besides, in the following paragraphs, those technique terms are replaced by English abbreviations. For example, light emitting diode is LED, pulse width modulation is PWM, input PWM signal is PWM_in and Dimming PWM is DPWM.

Figure 2:
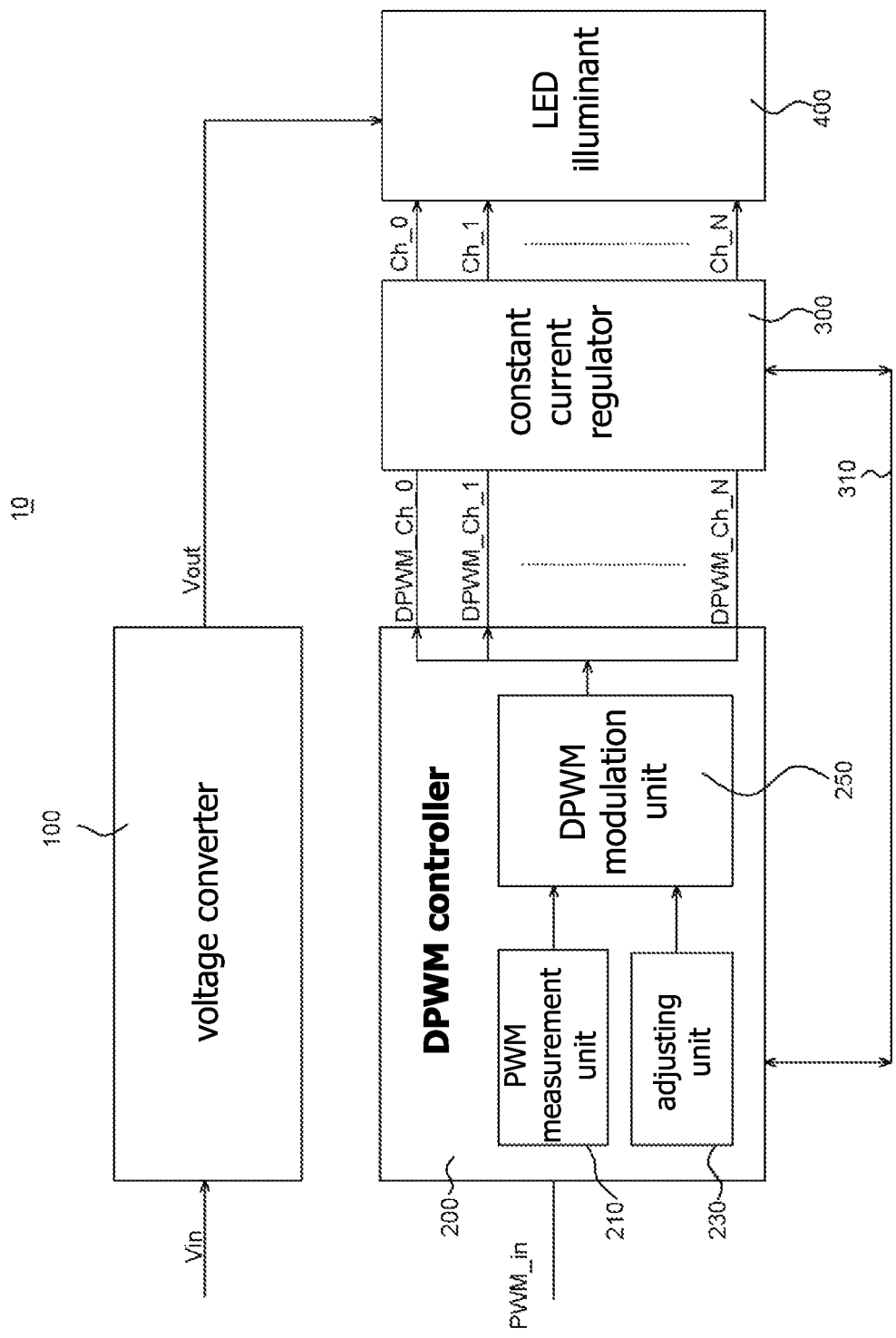
FIG. 2 is a block diagram illustrating the LED backlight module in the present invention.

Now, please referring FIG. 2, it is a block diagram illustrating the LED backlight module in the present invention. As shown in FIG. 2, the LED backlight module 10 includes a voltage converter 100, a PWM controller 200, a constant current regulator 300 connected to the PWM controller 200 and a LED illuminant device 400 respectively connected to the voltage converter 100 and the constant current regulator 300. Obviously, the LED illuminant 400 in the present invention is respectively connected to the output end of the voltage converter 100 and the input end of the constant current regulator 300, and a loop is generated from the input end of the voltage converter 100 to the LED illuminant device 400 and the constant current regulator 300. The output end of the voltage converter 100 is configured to provide a voltage control signal and is connected to several light channels of the LED illuminant device 400 in parallel. Each of the first input end of the constant current regulator 300 is connected to the PWM control signals. In addition, each of the second inputs in the constant current regulator 300 is connected to the light channel of the LED illuminant device 400. According to the control method disclosed in the present invention, the PWM signal with different phase and different duty cycle is able to drive the illuminant device between the light channels of the LED illuminant device 400.

Figure 1A:
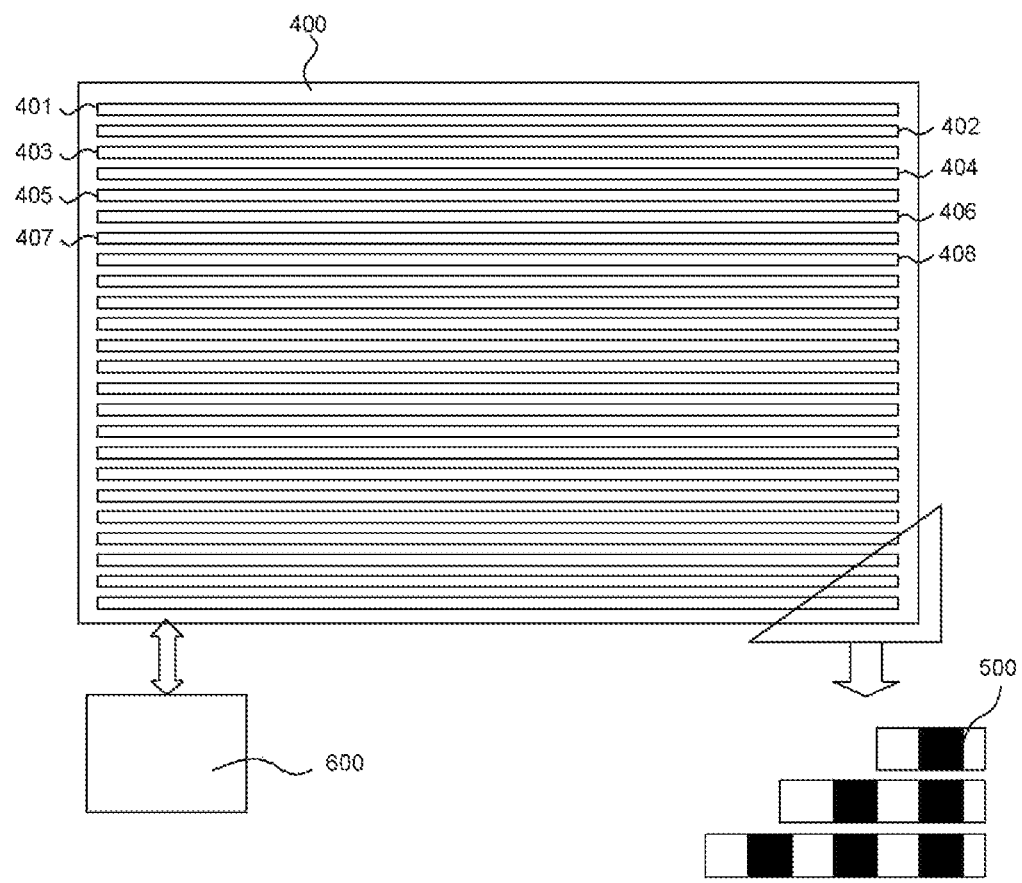
FIG. 1A is a view illustrating a direct backlight module made by conventional LED.
Figure 1B:
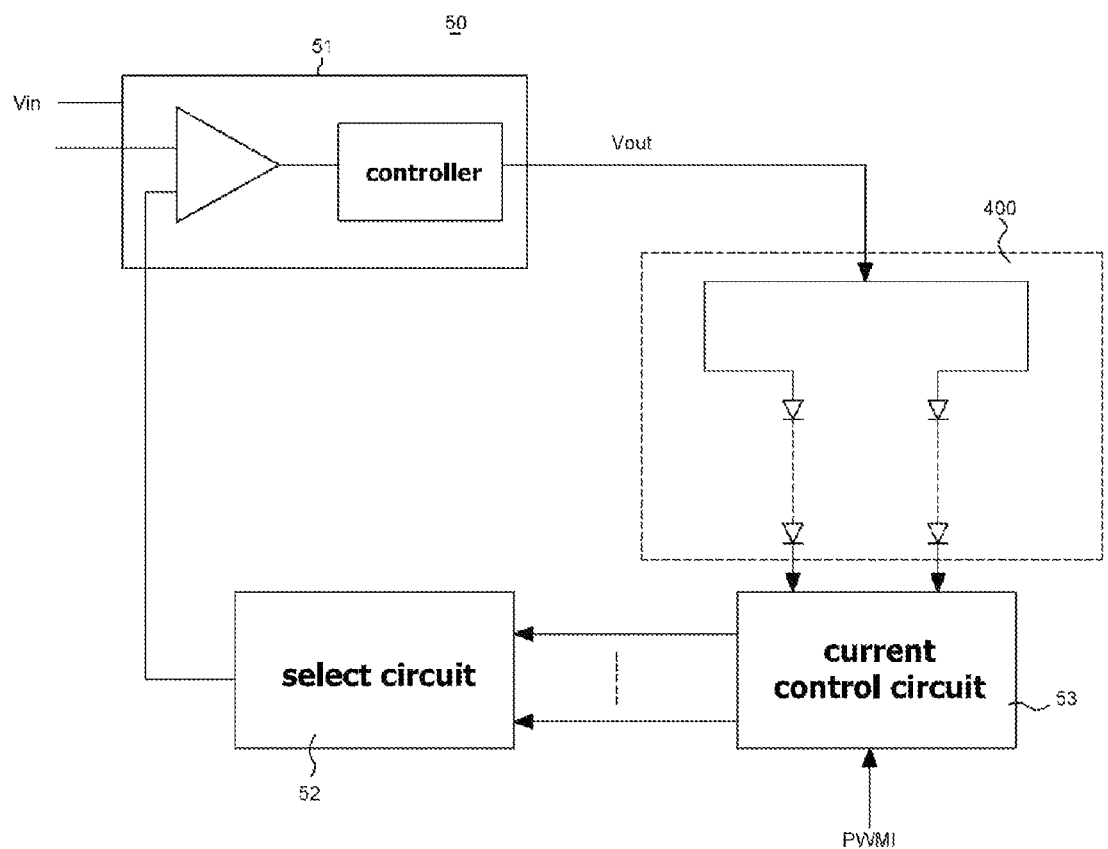
FIG. 1B is a block diagram illustrating the DC-DC converter of a LED backlight module in prior art.
Figure 1C:
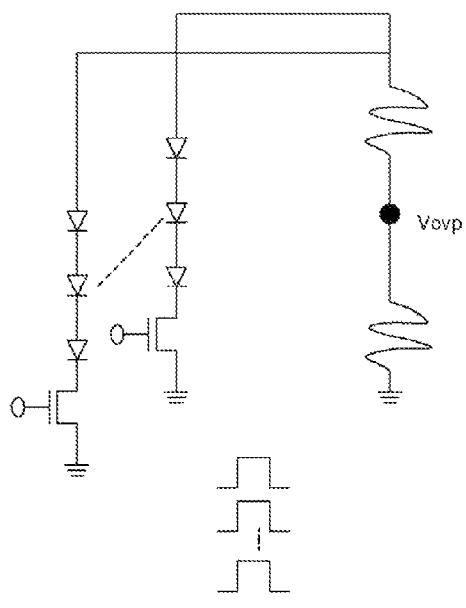
FIG. 1C is the equivalent circuit of an illuminant device in FIG. 1B.
Figure 1D:
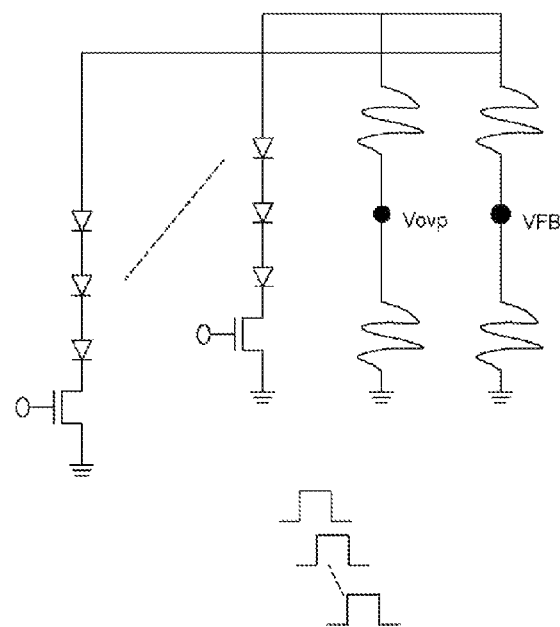
FIG. 1D is another conventional equivalent circuit of an illuminant device.

Now, as shown in FIG. 2, the voltage converter 100 converts an input voltage ($V_{in}$) to be an higher output voltage ($V_{out}$) and the voltage converter 100 is a DC-DC converter. The converted output voltage is transmitted to a LED illuminant device, such as a LED backlight module in LCD TV. The LED illuminant device 400 is made by several LED components 500 or several LED light channel 401. The LED light channel is made by several LED components 500 as shown in FIG. 1A. The LED illuminant 400 in the present invention also includes Dimming PWM controller 200 configured to convert a PWM_in signal to be several DPWM signals (DPWM channel, DPWM_ch) and the PWM_in signal is provided by the display system with LED illuminant device 400 (such as the controller provided by the LCD TV). The PWM controller 200 includes a PWM measurement unit 210, an adjusting unit and a DPWM modulator 250. The DPWM controller 200 transmits each of the digital DPWM signals to the first input of the constant current regulator 300 and the other input of the constant current regulator 300 is connected to one end of the LED illuminant device 400. The output end of the voltage converter 100 transmits the current in each channel to the LED illuminant device 400. Therefore, the PWM controller with adjusting function in the present invention is configured to convert the PWM signal to be the digital signal and the signal is processed by the adjusting unit 230 to be the corresponding digital signal. Therefore, the PWM controller with adjusting function in the present invention can be embedded to be a chip by semiconductor process so as to control PWM analog signal.

Still referring to FIG. 2, the constant current regulator 300 is connected to a predetermined number of feedback signals and the adjusting unit 230 of the DPWM controller 200 so as to form a current calibration handshake loop 310. In the present invention, in order to simply the detail description, the predetermined number of feedback signal in the constant current regulator 300 of the present embodiment is three, and there are three feedback signals in each channel connected to the adjusting unit 230 in the current calibration handshake loop 310 in the present invention. Therefore, the adjusting unit 230 is going to generate N channel adjusting signal Ch0_cal[2:0]~ChN_cal[2:0], where [2:0] is represented that there are three feedback signals (3 bits) in each channel. It should be noted that the current calibration hand shake loop 310 in the present invention can include two feedback signals (the adjusting unit 230 generates N channel adjusting signal Ch0_cal[1:0]~ChN_cal[1:0]), four feedback signals (the adjusting unit 230 generates N channel adjusting signal Ch0_cal[3:0]~ChN_cal[3:0]) or more than four feedback signals and it is not limited herein. In the present embodiment, the predetermined number of feedback signals is three. Obviously, those adjusting signals are transmitted in digital method.

When the LED illuminant device 400 in the present invention is turned on, the current calibration handshake loop 310 transmits the three feedback signals to the adjusting unit 230 and the adjusting unit 230 generates N adjusting signals (Ch0_cal[2:0]~ChN_cal[2:0]). The current status of the LED components 500 in each channel or the LED string 401 is transmitted to the adjusting unit 230 of the PWM controller 200 by the constant current regulator 300. The adjusting unit 230 generates N adjusting digital signals (Ch0_cal[2:0]~ChN_cal[2:0]) and the N adjusting digital signals are transmitted to the DPWM modulation unit 250. The current status is that the bias status in each light channel (the LED component 500 in each channel or each LED string 401) is different, and it is required to provide different current to drive. Especially when the PWM is used to save the power, it is necessary to provide a proper driving current in accordance with the status in each light channel so as to avoid bad driving to cause the illuminant or color is not consistent.

According to the operation procedure of the current calibration handshake loop 310 in the previous chapter, the PWM measurement unit 210 of the DPWM controller 200 will count the PWM_in signals to determine how many bits are used to transmit the digital signal by the PWM measurement unit 210 and the digital signals are transmitted to the DPWM modulation unit 250 to generate several DPWM control signals (DPWM_ch0~DPWM_chN). The DPWM control signals are transmitted to the constant current regulator 300. For example, when the time clock of the LED backlight module 10 is 20 MHz and the duty cycle of the PWM_in signal is 1 KHz, the PWM measurement unit 210 counts the PWM_in signals 20000 times in accordance with the time clock of the LED backlight module 10. When the 20000 times are converted to be binary code, 15 bits are used to shown the number of 20000 and represented by PWM_pulse[14:0].

Figure 3:
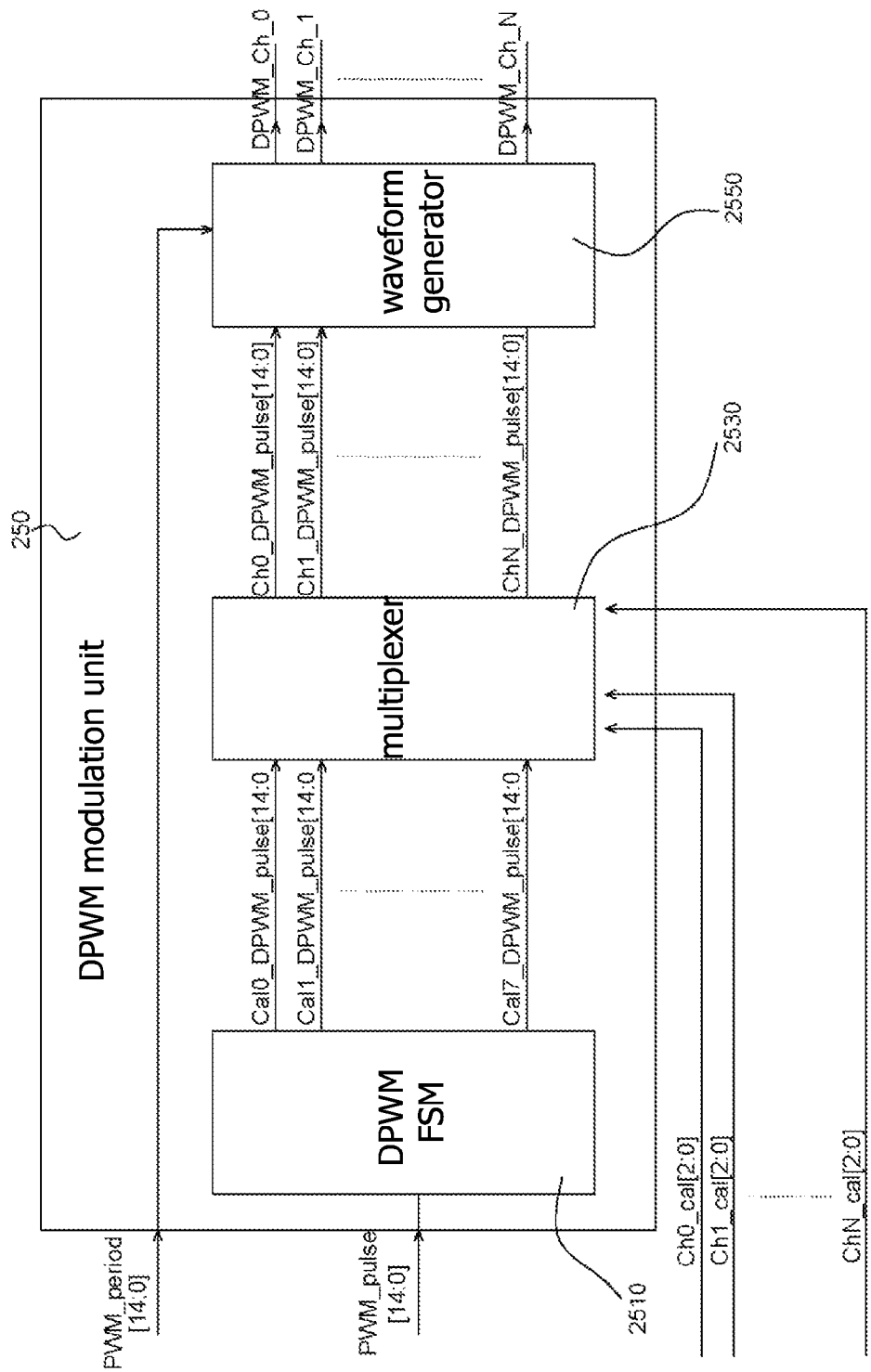
FIG. 3 is a system block diagram illustrating the DPWM modulation unit in the present invention.

Now, please referring to FIG. 3, it is a system block diagram illustrating the DPWM modulation unit in the present invention. As shown in FIG. 3, the DPWM modulation unit 250 includes a DPWM finite state machine (DPWM FSM) 2510, a multiplexer 2530 and a waveform generator 2550. The DPWM FSM 2510 will encode the 15 bits digital signal (PWM_pulse[14:0]) of the PWM measurement unit 210 in accordance with the PWM signal controlling requirement. The controlling requirement is going to proportionally reduce the PWM_in duty cycle. For example, if the preset controlling requirement is to reduce 0.4% of the PWM_in duty cycle for the light channel, the DPWM FSM 2510 will sequentially transmits 8 adjusted DPWM digital signals (Cal0_DPWM_pulse[14:0]~Cal7_DPWM_pulse[14:0]) and each of the adjusted DPWM control is to reduce 0.4% of PWM_in. 9 adjusted DPWM digital signal transmitted by the DPWM FSM 2510 is:

| 3 bits feedback signal | adjusted digital signal | PWM reducing ratio |
|---|---|---|
| 000 | Cal0_DPWM_pulse[14:0] | no adjusting |
| 001 | Cal1_DPWM_pulse[14:0] | reducing 4% |
| 010 | Cal2_DPWM_pulse[14:0] | reducing 8% |
| 011 | Cal3_DPWM_pulse[14:0] | reducing 12% |
| 100 | Cal4_DPWM_pulse[14:0] | reducing 16% |
| 101 | Cal5_DPWM_pulse[14:0] | reducing 20% |
| 110 | Cal6_DPWM_pulse[14:0] | reducing 24% |
| 111 | Cal7_DPWM_pulse[14:0] | reducing 28% |

The digital signal corresponding to each DPWM FSM 2510 channel is calculated as the following:

At first, if the 15 bits signal inputted by the PWM measurement unit 210 is PWM_pulse[14:0]=101_1011_0111_0100, the 15 bits signal is converted to be the decimal value: 23412.

Because the first adjusted digit Cal0_DPWM_pulse[14:0] in DPWM FSM 2510 won't be adjusted, the 15 bits digital signal Cal0_DPWM_pulse[14:0] outputted by the DPWM FSM 2510 is 101_1011_0111_0100 and transmitted to the multiplexer 2530 and the 15 bits digital signal is transmitted to the multiplexer 2530.

Because the second channel digit Cal1_DPWM_pulse[14:0] of the DPWM FSM 2510 is set to reduce 4% of PWM_in, the decimal calculation is 23412/1.04=22512. (round of to the unit place). Because the division cannot be used in digital circuit to calculate the 4% reduced value, the second channel value is calculated by the DPWM FSM 2510 and the calculation method is:

Each of the 15 bits digital signal 101_1011_0111_0100 included 1 is transformed to be the decimal value and each of the decimal values is divided by 1.04. Because only digit number is 1 will include a real value position, it is:

01_1011_0111_0100=23412(decimal system)=16384+4096+2048+512+256+64+32+16+4(decimal system)

then

23412/1.04=(16384+4096+2048+512+256+64+32+16+4)/1.04=(16384/1.04)+(4096/1.04)+(2048/1.04)+(512/1.04)+(256/1.04)+(64/1.04)+(32/1.04)+(16/1.04)+(4/1.04)

Now, each of the equations is calculated as the following:

$$16384/1.04=6384-(16384*(1-(1/1.04)))=16384-630 \quad (1)$$

$$4096/1.04=4096-(4096*(1-(1/1.04)))=4096-158 \quad (2)$$

$$2048/1.04=2048-(2048*(1-(1/1.04)))=2048-79 \quad (3)$$

$$512/1.04=512-(512*(1-(1/1.04)))=512-20 \quad (4)$$

$$256/1.04=256-(256*(1-(1/1.04)))=256-10 \quad (5)$$

$$64/1.04=64-(64*(1-(1/1.04)))=64-2 \quad (6)$$

$$32/1.04=32-(32*(1-(1/1.04)))=32-1 \quad (7)$$

$$16/1.04=16-(16*(1-(1/1.04)))=16-1 \quad (8)$$

$$4/1.04=4-(4*(1-(1/1.04)))=4-0 \quad (9)$$

Now, $$(1)+(2)+(3)+\ldots(9) \Rightarrow 23412/1.04 = 23412 -$$
$$(630+158+79+20+10+1+1)$$
$$= 22782-(158+79+20+10+1+1)$$
$$= 22624-(79+20+10+1+1)$$
$$= 22545-(20+10+1+1)$$
$$= 22525-(10+1+1)$$
$$= 22515-(1+1)$$
$$= 22514-1$$
$$= 22513$$

After 22513 is converted to be 101_0111_1111_0001, the 15 bits digital signal 101_0111_1111_0001 of the Cal1_DPWM_pulse[14:0] is transmitted to the multiplexer 2530 by the DPWM FSM 2510.

Other channels are calculated to be 15 bits digital signals in accordance with the calculation method described above.

Cal4_DPWM_pulse[14:0]=23412/1.16=20183(decimal system)

=100_1110_1101_0111

Cal5_DPWM_pulse[14:0]=23412/1.2=19510(decimal system)

=100_1100_0011_0110

Cal6_DPWM_pulse[14:0]=23412/1.24=18881(decimal system)

=100_1001_1100_0001

Cal7_DPWM_pulse[14:0]=23412/1.28=18291(decimal system)

=100_0111_0111_0011

Figure 4:
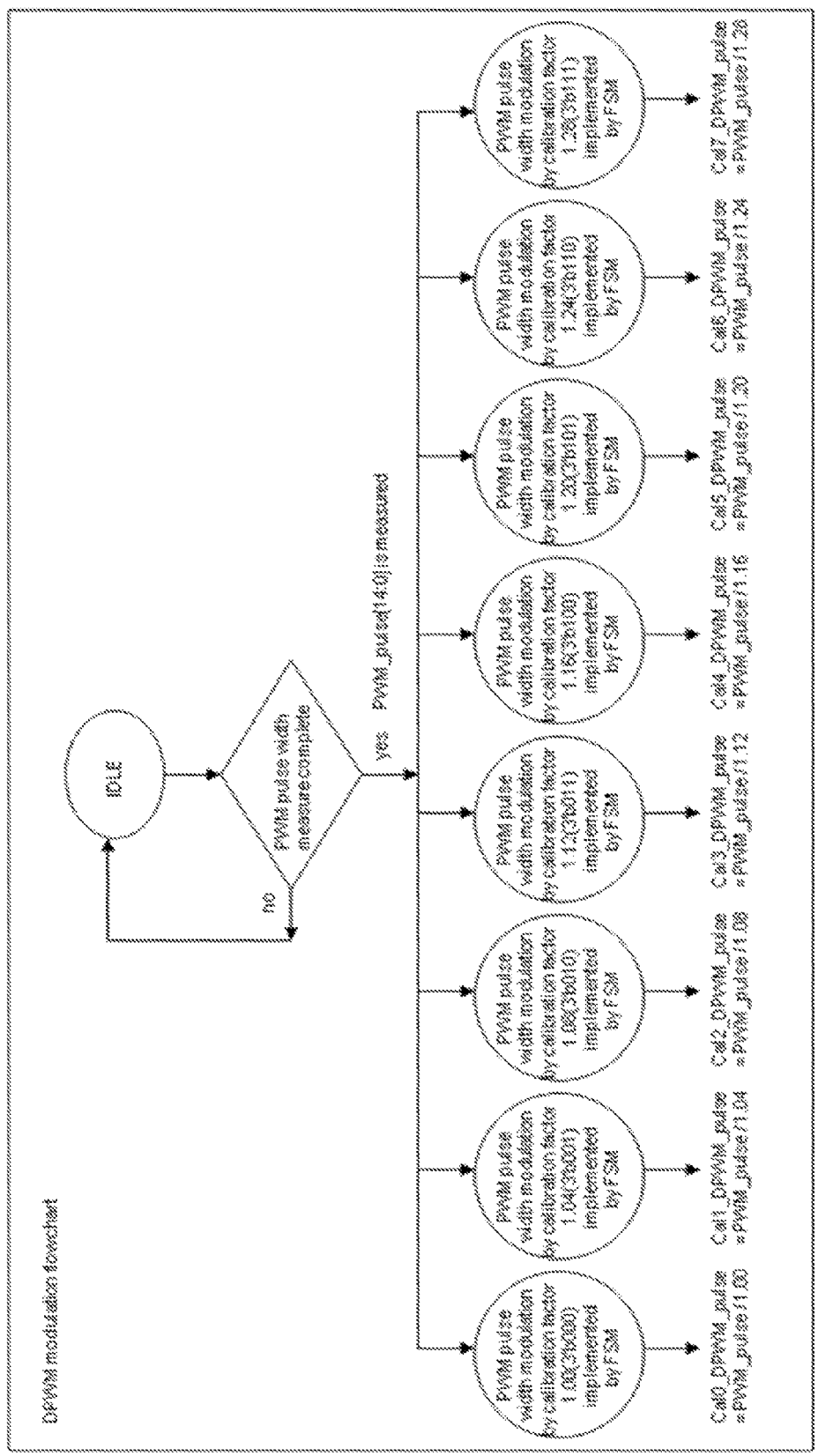
FIG. 4 is a view illustrating the DPWM FSM in the present invention is doing the digital encoding.

The $2^{nd}$~$8^{th}$ 15 bits digital signals calculated by the previous equations are transmitted to the multiplexer 2530. In addition, it should be noted that when the DPWM FSM 2510 in the present invention is doing digital decoding in accordance with the preset PWM signal control method, 8 adjusting values are doing digital decoding at the same time, as shown in FIG. 4. Of course, the 8 adjusting values can also do digital decoding sequentially, and it is not limited herein. Moreover, as the description above, the number N of the channels of the DPWM FSM 2510 in the present invention can be 8 channels, 16 channels, 32 channels or above and it is not limited herein. The alphabet N is only used to present the number of channels in the embodiments of the present invention.

Please refer to FIG. 3 now, when the DPWM FSM 2510 generates 8 adjusted DPWM digital encoding signals and transmits to the first input of the multiplexer 2530. The second input of the multiplexer 2530 is connected to several adjusting signals (Ch0_cal[2:0]~ChN_cal[2:0]) generated by the adjusting unit 230.

Figure 5:
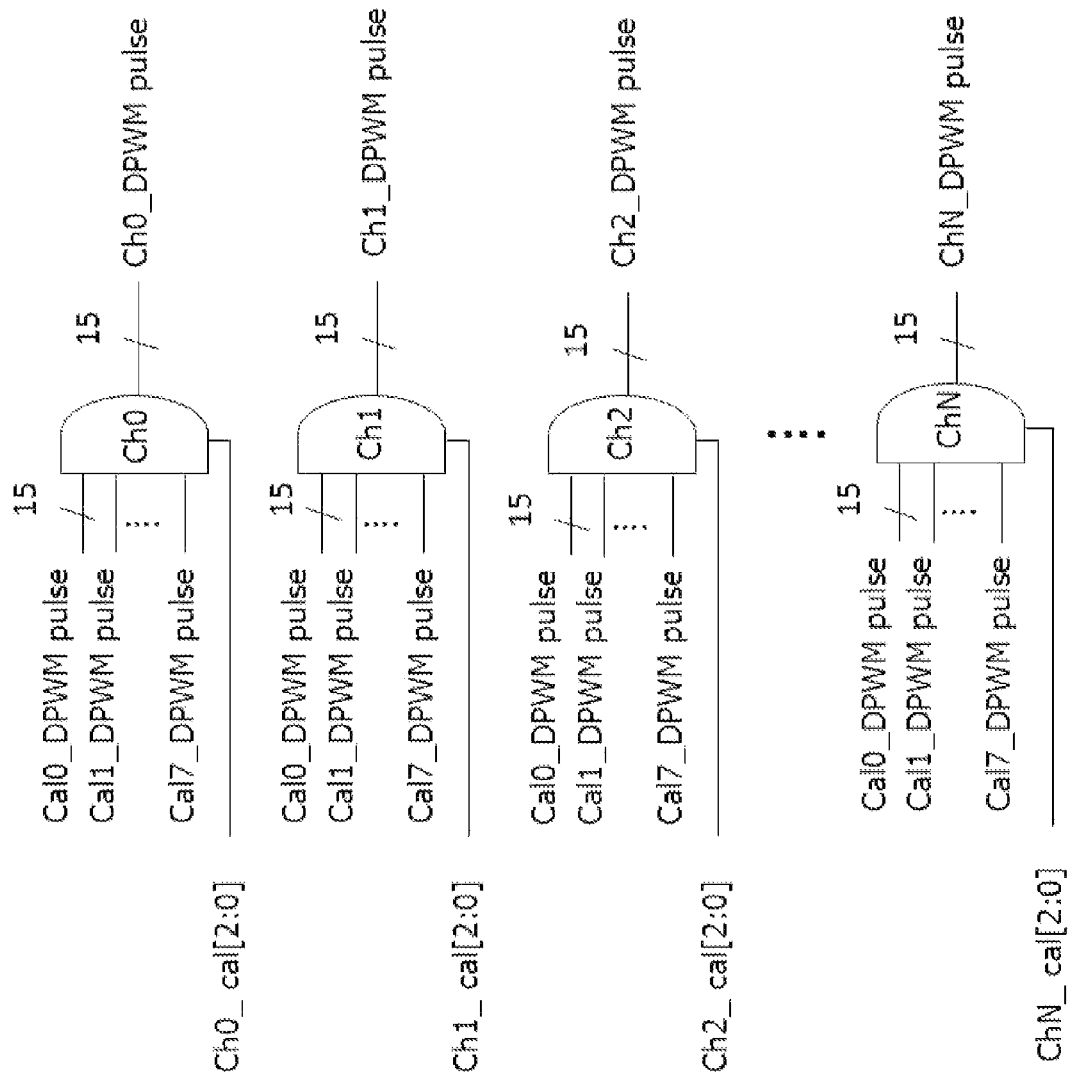
FIG. 5 is a view illustrating the circuit of the multi-task component in the present invention.

The operation method of the multiplexer 2530 is shown in FIG. 5, and it is a circuit view of the multiplexer in the present invention. As shown in FIG. 5, the multiplexer 2530 is made by several circuit components and the circuit component is a multi-task selector in the present embodiment. Moreover, as the description above, the number of the channels of the multiplexer 2530 in the present invention can be 16 channels, 32 channels or above and it is not limited herein. The first input in the multi-task selector is connected to the 8 DPWM signals transmitted by the DPWM FSM 2510. There is a 15 bits digital signal in each DPWM signal and the second input in the multi-task selector is connected to the adjusting signal (Ch0_cal[2:0]~ChN_cal[2:0]) generated by the adjusting unit 230. Therefore, when the 3 loops of the current calibration handshake loop 310 are connected to the adjusting unit 230 and the adjusting unit 230 generates 8 adjusting signals, each of the second inputs of the multi-task selector is connected to a adjusting signal (Ch_cal[2:0]). The multiplexer will choose the best digital encoding signal in 8 15 bits digital encoding signals according to the adjusting signal and transmits the best digital encoding signal to the first input of the pulse generating unit 2550.

Obviously, the multiplexer 2530 includes several channels by the multi-task selector. The number of the channels in the multiplexer 2530 is determined by the LED quantity. For example, as the embodiment in FIG. 5, the multiplexer 2530 is configured to control N LEDs, and the multiplexer 2530 includes N channels formed by the N multi-task selector. Each of the multi-task selector will choose the DPWM 15 bits digital signal in accordance with the adjusting signal (Ch_cal[2:0]) to receive a best digital encoding signal (Ch_PWM_pulse[14:0]). The 15 bits digital encoding signal (Ch_PWM_pulse[14:0]) in the N channels is transmitted to the pulse generator 2550.

It should be noted that, in the present embodiment, the multiplexer 2530 includes N output channels made by N multi-task selectors 2530. The first input in each of the multi-task selectors is connected to the 8 DPWM transmitted by the DPWM FSM 2510. The second input of the multiplexer 2530 is connected to the one of the N adjusting signals generated by the adjusting unit 230. Therefore, when the multiplexer 2530 is an output channel, the connection method is to sequentially connect the $1^{st}$ to $N^{th}$ multi-task selector with one adjusting signal. When the multiplexer 2530 is in operation, each of the multi-task selectors will choose one the best digital encoding signal in accordance with an adjusting signal to output. Therefore, when the multiplexer 253 includes N output channels, the 15 bits digital encoding signal outputted in each of the channels could be the same or different, but the signal must be chosen from 8 15 bits digital signals in the first input end.

Now referring to FIG. 3, when the multiplexer 2530 chose 15 bits digital encoding signal of the N channels, the 15 bits digital encoding signal is transmitted to the first input end of the pulse generator 2550. The second input end of the pulse generator 2550 is connected to the 15 bits digital signal (PWM_pulse[14:0]) of the measurement unit 210. According to the digital encoding signal (Ch0_DPWM_pulse[14:0]~ChN_DPWM_pulse[14:0]) in N channels of the first input end and the 15 bits digital signal in the second input end, the pulse generator 2550 outputs N analog DPWM control signals (analog DPWM signal DPWM_ch0~DPWM_chN) and transmits the analog DPWM control signal to the constant current regulator 300. When each of the analog DPWM control signal is inputted to the constant current regulator 300, each of the analog DPWM control signals is processed in the constant current regulator 300 and the current in each channels is transmitted to one LED illuminant device 400.

When the LED illuminant device 400 in the present invention is in the turn on procedure, a digital encoding signal (Ch_PWM_pulse[14:0]) is chosen between the N adjusting signal and the 8 15 bits digital signals by the multiplexer 2530. The best 15 bits digital encoding signal is transmitted to the pulse generator 2550 to convert to be analog DPWM control signal. The DPWM control signal device 200 outputs the DPWM control signal to the constant current regulator 300. The main purpose is to transmit the current status in each channel of the LED component or several LED strings 401 to the adjusting unit 230 of the PWM control device 200 by the constant current regulator 300. The adjusting unit 230 will output N adjusting digital signal to the DPWM modulation unit 250. The current status is that the bias voltage in each illuminant channel is different (such as the LED component 500 in each channel or each LED string 401), so different currents are required to drive the illuminant channel. When the PWM is used to save power energy, each illuminant is required to provide proper driving current to avoid the illuminant or color is not consistent because of bad driving.

Figure 6:
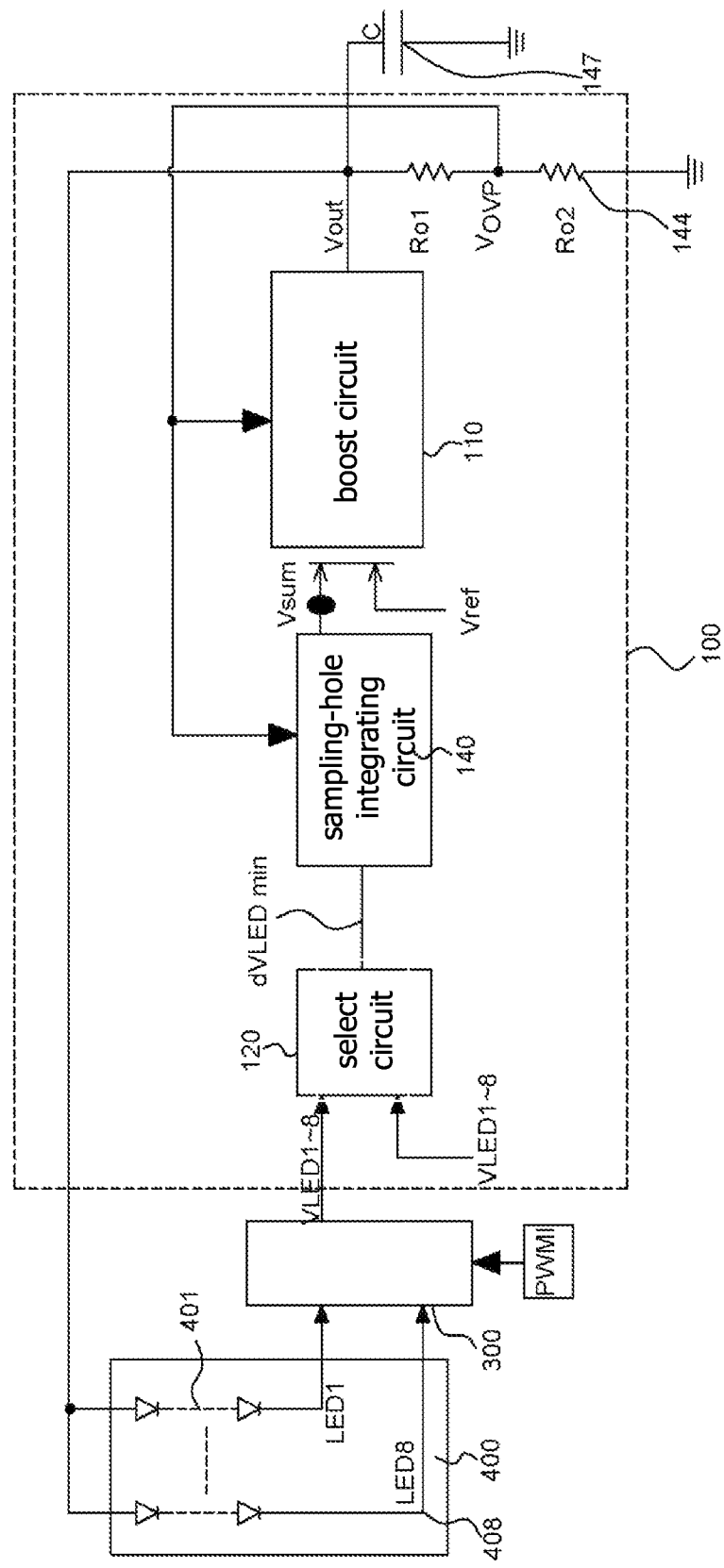
FIG. 6 is a system block diagram of the voltage converter in the present invention.

Now, please referring to FIG. 6, it is a system block diagram of the voltage converter in the present invention. As shown in FIG. 6, one end of the voltage converter 100 is connected to the pulse width modulation signal (VLED) in each illuminant channels (ex: LED1-LED8). The DPWM control signal outputted by the DPWM control signal device 200 is transmitted from the PWMI to the constant current regulator 300, and the pulse width modulation signal (VLED) in each illuminants is modulated by transmitting to the constant current regulator 300 and the inputted pulse width modulation signal so as to output the pulse width modulation signal (such as VLED1-8) in each illuminant channel. Obviously, the DPWM signal of the DPWM control signal device 200 in FIG. 3 is transmitted to the constant current regulator 300 from the PWMI in FIG. 6.

The voltage converter 100 includes a boost circuit 110, a minimum voltage selector 120, a sample-hold and integrating circuit 14, and an overvoltage protection voltage 144. The input end of the minimum voltage selector 120 is connected to the PWM signal (VLED1-8) and several reference voltage (LED_ref1-8). The output end thereof is connected to the minimum voltage signal (dVLED_min). The minimum voltage signal (dVLED_min) is transmitted to the sampling-hold and integrating circuit 140 and a superposition voltage (Vsum) is generated by the superposition theory of the sampling-hold and integrating circuit 140. Therefore, the superposition voltage is transmitted to the boost circuit 110 and compared with a reference voltage (Vref) to output a output voltage (Vout) to the LED illuminant device 400 so as to form a loop. In addition, the output voltage (Vout) is connected to the overvoltage protection circuit 144. The overvoltage protection circuit 144 is made by the series resistant R01 and R02. One end of the series resistant R01 and R0 is connected to the output voltage (Vout) of the boost circuit 110 and the other end is grounded. The node voltage ($V_{ovp}$) between the series resistant R01 and R02 is calculated by dividing voltage. The node voltage ($V_{ovp}$) is feedback to the boost circuit 110 and the sample-hold and integrating circuit 140 and the output voltage ($V_{out}$) is connected to a capacitance 147. When the PWM control signal is conductive, the output voltage ($V_{out}$) can provide the proper current for LED illuminant 400 and charge the capacitance 147. When the PWM control signal is not conductive, the output voltage ($V_{out}$) is kept at a proper voltage in accordance with the capacitance 147.

Figure 7:
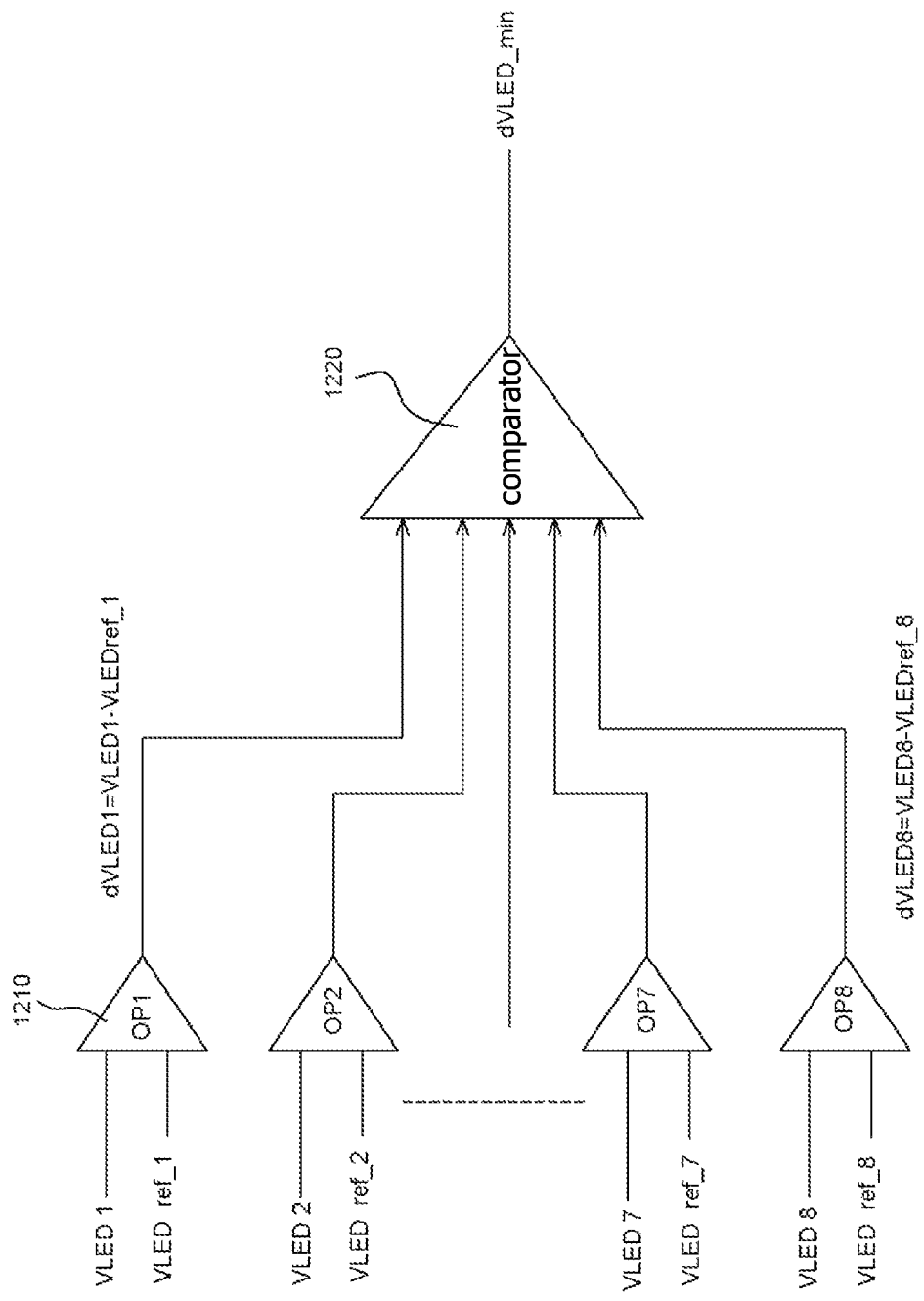
FIG. 7 is a view illustrating the minimum select circuit in the present invention.

FIG. 7 is a view illustrating the minimum select circuit in the present invention. As shown in FIG. 7, the minimum select circuit 120 includes several first comparators 1210 and a second comparator 1220 and the first input end in each of the first comparators 1210 is connected to the PWM signal (VLED1-8) in each illuminant channel. The second input end is connected to the reference voltage (VLED_ref1-8). The output end in each comparator 1210 will output a voltage difference value (dVLED) to the input end of the second comparator 1220. The second comparator 1220 will output the minimum voltage signal (dVLED_min) in several input voltages. In the embodiment of the present invention, the reference voltages (VLED_ref) can be respectively transmitted (such as VLED_ref_1; VLED_ref_2 ... ) and are compared to the PWM signal (VLED_1, VLED_2 ... ) in each channel so as to output the compared result to the second comparator 1220. The method to provide the reference voltage (VLED_ref) is not limited herein, and it all depends on the designer's requirement.

Figure 8:
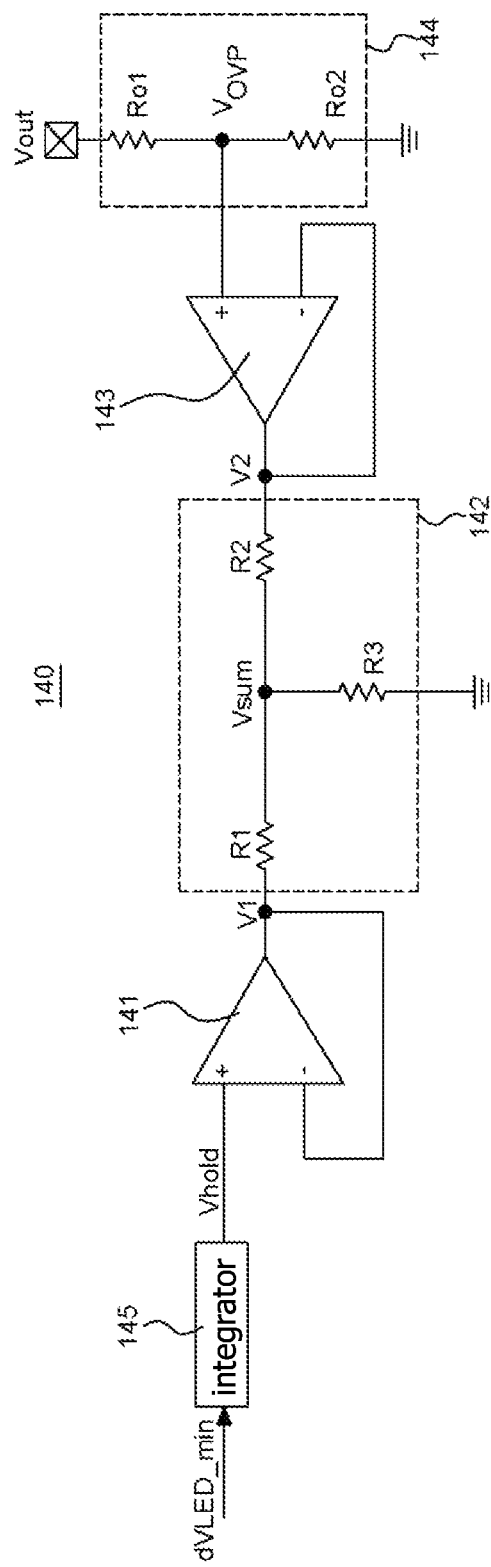
FIG. 8 is a circuit view illustrating the sampling-hold and integrating circuit in the present invention.

FIG. 8 is a circuit view illustrating the sampling-hold and integrating circuit in the present invention. As shown in FIG. 8, the sampling-hole and integrating circuit 140 includes a first differential amplifier 141 and the first input thereof is connected to an integrator 145 configured to maintain the voltage inputted in the first input end of the first differential amplifier 141 to be more than 0V. The second input end is feedback to connect to the output end V1 of the first differential amplifier 141. The output end V1 of the first differential amplifier 141 is connected to a first voltage dividing circuit 142 formed by several resistors. For example, in the present embodiment, the resistors R1, R2 and R3 are together to form the first voltage dividing circuit 142 and R3 is connected to R1 and R2 in parallel. The first input end of the second differential amplifier 143 is connected to the note voltage ($V_{ovp}$) formed by over-voltage protection circuit 144 and the note voltage ($V_{ovp}$) is the voltage protection circuit 144 feedback to the first input of the second differential amplifier 143. The second input end is connected to the output end V2 of the second differential amplifier 143. The output end V2 of the second differential amplifier 143 is connected to the first dividing voltage 142.

In the embodiment of the sampling-hold and integrating circuit 140 of the present invention, the minimum voltage signal (dVLED_min) outputted by the minimum voltage select circuit 120 is transmitted to the integrator 145 of the sampling-hold and integrating circuit 140 and the integrator 145 will raise the minimum voltage to be a holding voltage ($V_{hold}$). However, in a preferred embodiment, the gain of the first differential amplifier 141 of the sampling-holding and integrating circuit 140 is set to be 1 and the $V_{hold}$=V1 in the first differential amplifier 141. The gain of the second differential amplifier 143 of the integrator 140 is also set to be 1 and the Vovp=V2 in the second differential amplifier. Obviously, the first dividing voltage 142 of the sampling-hold and integrating circuit 140 is able to get the superposition voltage ($V_{sum}$) in accordance with the holding voltage ($V_{hold}$) and the note voltage (Vovp) by the superposition theory, where:

$$V_{sum} = \frac{[(R1 \times R3 \times V2) + (R2 \times R3 \times V1)]}{(R1 \times R2) + (R2 \times R3) + (R3 \times R1)}$$

When the superposition voltage is calculated, it is transmitted to the boost circuit 110 in FIG. 6 and compared with the reference voltage ($V_{ref}$) to transmit an output voltage ($V_{out}$) by the boost circuit 110. The output voltage ($V_{out}$) is connected to the over-voltage protection circuit 144 and calculated to receive a note voltage ($V_{ovp}$) by the voltage dividing theory. The note voltage ($V_{ovp}$) is feedback to the first input end of the second differential amplifier 143. The superposition voltage ($V_{sum}$) is also the amplified differential feedback voltage. The superposition voltage ($V_{sum}$) is calculated to get the dividing voltage value of the output end V2 of the second differential amplifier 143, and the note voltage ($V_{ovp}$) formed by the over-voltage protection circuit 144 (the second voltage dividing circuit) is determined, where $$V_{OVP} = V2 = \frac{[V_{sum} \times ((R1 \times R2) + (R2 \times R3) + (R1 \times R3)) - (R2 \times R3 \times V1)]}{R1 \times R3}$$

As shown in FIG. 6, the reference voltage ($V_{ref}$) in the boost circuit 110 is designed by the requirement of the user. In a steady state, the reference voltage ($V_{ref}$) is equal to the superposition voltage ($V_{sum}$) and the note voltage of the second dividing voltage circuit is:

$$V_{OVP} = V2 = \frac{[V_{ref} \times ((R1 \times R2) + (R2 \times R3) + (R1 \times R3)) - (R2 \times R3 \times V_{hold})]}{R1 \times R3}$$

As the equation above, when the reference voltage ($V_{ref}$) is determined, the note voltage ($V_{ovp}$) is changed in accordance with the holding voltage ($V_{hold}$). For example, when the holding voltage is in a rising stage, the note voltage (Vovp) is decreased and the output voltage ($V_{out}$) is decreased. When the holding voltage ($V_{hold}$) is in a descending stage, the note voltage is increased and the output voltage is increased ($V_{out}$). Therefore, when the reference voltage ($V_{ref}$) is set to be determined, the output voltage ($V_{out}$) is able to adjust to be a better specification. For example, the output voltage (Vout) is set to be match the specification of the minimum voltage is 0 (DVLED_min=0). The activation of the over-voltage protection circuit 144 in the present embodiment won't be affected by the control method of the entire system.

Therefore, when the PWM signal is on in the duty cycle, each of the illuminant channels (401-408) in the LED backlight module 400 absorbs the current from the output voltage ($V_{out}$). When the PWM signal is off in the duty cycle, the boost circuit 110 is turned off and the voltage required at each of the illuminant channels (401-408) is provided by the capacitance 147. The output voltage would not be varied when the PWM signal is off at the duty cycle. Moreover, the voltage converter 100 in the present invention can select a PWM signal with a minimum different value compared to the reference voltage in the PWM signals of a plurality of the illuminant channel (401-408) and the PWM signal is calculated by the sampling-hold and integrating circuit 140 and the boost circuit 110 to output a output voltage ($V_{out}$). Obviously, the voltage converter 100 in the present invention can generate a proper output voltage ($V_{out}$) to drive the LED backlight module 400 in accordance with the PWM signals of a plurality of the illuminant channels (401-408) of the LED backlight module 400.

Now please referring to FIG. 2 and FIG. 9, FIG. 9 is a signal view illustrating the PWM signal controls the LED backlight module in the present invention. As shown in FIG. 2, when the constant current regulator 300 executed the controlling signals, several currents are outputted to each of the illuminant channels (401-408) in the LED backlight module 400 and each of the illuminant channels (401-408) in the LED backlight module 400 would output several modulated PWM signals (VLED1-8). Obviously, when the PWM signal is on in the duty cycle, each of the illuminant channels (401-408) absorbs the currents from the output voltage ($V_{out}$), and the practical absorbing voltage is the combination of the output voltage (Vout) an the PWM signal (VLED) in each illuminant channel (401-408), as shown in FIG. 9. Because the bias voltage in each of the illuminant channels (401-408) in the present invention is provided in accordance with the DPWM control signal outputted by the DPWM control device 200 to the constant current regulator 300. As the description above, the bias statues in each of the illuminant channels (401-408) can be different. Therefore, when the PWM signal is used to save the power, the DPWM control device 200 in the present invention is used to provide proper driving current in accordance with the status in each of the illuminant channels to avoid the illuminant or color is not consistence because of unsuccessful driving. The sampling-hold and integrating circuit 140 in the present invention is used to provide an output voltage ($V_{out}$) generated by the minimum voltage difference to each of the illuminant channels (401-408) of the LED illuminant device 400. Therefore, the PWM controlling device and the voltage converter 100 of the sampling-hold and integrating circuit 140 are used in the present invention to the control loop of the bias status in each of the illuminant channels so as to provide different phase and different duty cycle of the PWM signal to the LED backlight module 400 and the purpose of the power saving. Obviously, the control loop in the present invention with proper setting to transmit the PWM signal with the same phase, the same frequency and the same duty cycle to the LED backlight module 400 is the preferred embodiment in the present invention.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A module unit with adjusting pulse width functions and connected to a first digital signal and a plurality of second digital signals, and the module unit comprises:
    a finite state machine including an input end connected to the first digital signal and configured to encode the first digital signal by a predetermined control requirement to generate and output a plurality of third digital signals with different encoding codes;
    a multiplexer made by a plurality of circuit components and including a first input end in each circuit components connected to the third digital signal and a second input end in each circuit component connected to the second digital signal, and is configured to output a plurality of forth digital signals with different encoding codes; and
    a pulse generator including a first input end connected to the first digital signal and a second input end connected to the forth digital signal, and is configured to convert the forth digital signal to be a plurality of analog signals.

2. The modulation unit of claim 1, wherein the predetermined control requirement is to proportionally decrease a valid cycle of the input PWM signal.

3. The modulation unit of claim 1, wherein the finite state machine is configured to generate the third digital signals by a parallel process method.

4. The module unit of claim 1, wherein the circuit components of the multiplexer are multi-task selectors.

5. A control device with adjusting pulse width function and is connected to an inputted pulse width modulation signal and a plurality of adjusting loops, and the control unit comprises:
    a measurement unit configured to count the input PWM signal, convert the input PWM signal to be a first digital signal with a plurality of bits and output the first digital signal;
    an adjusting unit connected to the adjusting loops and configured to generate a plurality of second digital signals with different encoding codes;
    a module unit including an input end connected to the first digital signal and the second digital signal, and the first digital signal is encoded by a predetermined control requirement so as to output a plurality of analog signals.

6. The control device of claim 5, wherein the predetermined control requirement is to proportionally decrease a valid cycle of the input PWM signal.

7. The control device of claim 5, wherein the module unit is connected to the first digital signals and the second digital signal and the module unit includes:
    a finite state machine including an input end connected to the first digital signal and configured to encode the first digital signal by a predetermined control requirement to generate and output a plurality of third digital signals with different encoding codes;
    a multiplexer made by a plurality of circuit components and including a first input end in each circuit components connected to the third digital signal and a second input end in each circuit component connected to the second digital signal, and is configured to output a plurality of forth digital signal with different encoding codes; and
    a pulse generator including a first input end connected to the first digital signal and a second input end connected to the forth digital signal, and is configured to convert the forth digital signal to be a plurality of analog signals.

8. The control device of claim 7, wherein the circuit components of the multiplexer are multi-task selectors.

9. A backlight module, comprising:
    a voltage converter configured to convert a input voltage (Vin) to be a higher output voltage (Vout);
    a control device connected to a input PWM signal and a plurality of adjusting loop, and the control device includes:
    a measurement unit configured to count the input PWM signal, convert the input PWM signal to be a first digital signal with a plurality of bits and output the first digital signal;
    an adjusting unit connected to the adjusting loops and configured to generate a plurality of second digital signals with different encoding codes;
    a module unit including an input end connected to the first digital signal and the second digital signal, and the first digital signal is encoded by a predetermined control requirement so as to output a plurality of analog signals;
    a current regulator connected to the analog signals outputted by the control device;

a plurality of adjusting loops connected to the adjusting unit and the current regulator; and a LED illuminant device made by a plurality of LED illuminant unit, and each of the illuminant units is connected to the analog signal.

10. The control device of claim 9, wherein the module unit is connected to the first digital signals and the second digital signal and the module unit includes:

a finite state machine including an input end connected to the first digital signal and configured to encode the first digital signal by a predetermined control requirement to generate and output a plurality of third digital signals with different encoding codes;

a multiplexer made by a plurality of circuit components and including a first input end in each circuit components connected to the third digital signal and a second input end in each circuit component connected to the second digital signal, and is configured to output a plurality of forth digital signal with different encoding codes; and a pulse generator including a first input end connected to the first digital signal and a second input end thereof connected to the forth digital signal, and is configured to convert the forth digital signal to be a plurality of analog signals.

11. A voltage converter including one end connected to a constant current regulator and the constant current regulator is connected to a PWM signal of the illuminant channels, wherein the voltage converter is characteristic by:

a minimum voltage selector including an input end respectively connected to a PWM signal of the illuminant channels and a plurality of first reference voltages corresponding to the plurality of illuminant channels, and an output end outputting a minimum voltage signal;

a sampling-hold and integrating circuit including a first input end and a second input end, and the first input end is connected to the minimum voltage signal of the minimum voltage selector and outputs an superposition voltage; and a boost circuit including a first input connected to the superposition voltage of the sampling-hold and integrating circuit, a second input end connected to a second reference voltage, and an output end connected to the illuminant channel in the LED backlight module; wherein the second voltage dividing circuit provides a note voltage and the note voltage is connected to the second input end of the sampling-hold and integrating circuit and the boost circuit, and the note voltage is calculated by the output voltage and the second voltage dividing circuit by a voltage dividing theory; and wherein the superposition voltage is calculated by the first voltage dividing circuit of the sampling-hold and integrating circuit, the minimum voltage signal and the note voltage by superposition theory.

12. The voltage converter of claim 11, wherein the sampling-hold and integrating circuit includes:

a first differential amplifier including a first input end connected to an integrator and a second input end connected to an output end of the first differential amplifier to form a feedback loop;

a second differential amplifier including a first input end connected to a note voltage provided by the second voltage dividing circuit and a second input end connected to a output end of the second differential amplifier; and a first voltage dividing circuit made by a plurality of resistors, and includes one end connected to the output end of the first differential amplifier and a second end connected to the output end of the second differential amplifier;

wherein the integrator is connected to the minimum voltage signal outputted by the output end of the minimum voltage selector at minimum conduction.

13. The voltage converter of claim 12, wherein the gain of the first differential amplifier and the gain of the second differential amplifier are 1.

14. The voltage converter of claim 12, wherein the output voltage of the first differential amplifier is larger than 0V.

15. A LED backlight module connected to a PWM signal and the LED backlight module comprises:

a LED backlight module made by a plurality of illuminant channels;

a constant current regulator including a first input end connected to the illuminant channel of the LED backlight module, a second input end connected to the PWM signal and an output end configured to output the PWM signal of the illuminant channel;

a voltage converter includes:

a minimum voltage selector, and an input end is respectively connected to a PWM signal of the illuminant channels and a plurality of first reference voltages corresponding to the plurality of illuminant channels, and an output end thereof outputs a minimum voltage signal at minimum conduction;

a sampling-hold and integrating circuit including a first input end and a second input end, and the first input end is connected to the minimum voltage signal of the minimum voltage selector and outputs a superposition voltage;

a boost circuit including a first input connected to the superposition voltage of the sampling-hold and integrating circuit, a second input end connected to a second reference voltage, and an output end connected to the illuminant channel in the LED backlight module;

wherein the second voltage dividing circuit provides a note voltage and the note voltage is connected to the second input end of the sampling-hold and integrating circuit and the boost circuit, and the note voltage is calculated by the output voltage and the second voltage dividing circuit by a voltage dividing theory;

and the superposition voltage is calculated by the first voltage dividing circuit of the sampling-hold and integrating circuit, the minimum voltage signal and the note voltage by an superposition theory;

a control device connected to the PWM signal and a plurality of adjusting loops outputted by the constant current regulator and outputs a plurality of digital signals to the input end of the constant current regulator.

16. The backlight module of claim 15, wherein the sampling-hold and integrating circuit includes:

a first differential amplifier including a first input end connected to an integrator and a second input end connected to an output end of the first differential amplifier to form a feedback loop;

a second differential amplifier including a first input end connected to a note voltage provided by the second voltage dividing circuit and a second input end connected to a output end of the second differential amplifier;

a first voltage dividing circuit made by a plurality of resistors, and includes one end connected to the output end of the first differential amplifier and a second end connected to the output end of the second differential amplifier;

wherein the integrator is connected to the minimum voltage signal outputted by the output end of the minimum voltage selector at minimum conduction.

17. The voltage converter of claim 16, wherein the gain of the first differential amplifier and the gain of the second differential amplifier are 1.

18. The backlight module of claim 16, wherein the control device includes:
- a measurement unit configured to count the input PWM signal, convert the input PWM signal to be a first digital signal with a plurality of bits and output the first digital signal;
- an adjusting unit connected to the adjusting loops and generates a plurality of second digital signals with different encoding codes; and
- a module unit including an input end connected to the first digital signal and the second digital signal, and the first digital signal is encoded by a predetermined control requirement to output a plurality of analog signals.

19. The backlight module of claim 18, wherein the module unit is connected to the first digital signals and the second digital signal, and wherein the module unit includes:
- a finite state machine including an input end connected to the first digital signal and configured to encode the first digital signal by a predetermined control requirement to generate and output a plurality of third digital signals with different encoding codes;
- a multiplexer made by a plurality of circuit components and includes a first input end in each circuit components is connected to the third digital signal and a second input end in each circuit component is connected to the second digital signal, and is configured to output a plurality of forth digital signal with different encoding codes; and
- a pulse generator including a first input end connected to the first digital signal and a second input end thereof is connected to the forth digital signal, and is configured to convert the forth digital signal to be a plurality of analog signals.

20. The backlight module of claim 15, further including a capacitance connected the note voltage.

* * * * *